United States Patent
Takeya et al.

(10) Patent No.: US 7,969,145 B2
(45) Date of Patent: Jun. 28, 2011

(54) POSITION DETECTING DEVICE WITH A MAGNETORESISTIVE ELEMENT

(75) Inventors: Tsutomu Takeya, Niigata-ken (JP);
Takafumi Noguchi, Niigata-ken (JP);
Takashi Onodera, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 547 days.

(21) Appl. No.: 12/035,824

(22) Filed: Feb. 22, 2008

(65) Prior Publication Data

US 2008/0284420 A1 Nov. 20, 2008

(30) Foreign Application Priority Data

May 16, 2007 (JP) ................... 2007-130462

(51) Int. Cl.
*G01B 7/14* (2006.01)
(52) U.S. Cl. .............. 324/207.21; 324/207.24
(58) Field of Classification Search ............ 324/207.21, 324/207.24
See application file for complete search history.

(56) References Cited

U.S. PATENT DOCUMENTS

| | | | | |
|---|---|---|---|---|
| 3,060,370 A | * | 10/1962 | Varterasian | 323/368 |
| 4,395,695 A | * | 7/1983 | Nakamura | 338/32 H |
| 5,644,228 A | * | 7/1997 | Jeffers et al. | 324/235 |
| 6,018,241 A | * | 1/2000 | White et al. | 324/207.2 |
| 6,323,641 B1 | * | 11/2001 | Allwine | 324/207.2 |
| 6,496,003 B1 | * | 12/2002 | Okumura et al. | 324/207.24 |
| 2002/0105322 A1 | * | 8/2002 | Schroeder et al. | 324/207.25 |
| 2003/0112006 A1 | * | 6/2003 | Luetzow | 324/207.21 |
| 2004/0000902 A1 | * | 1/2004 | Tokunaga et al. | 324/207.2 |
| 2007/0194786 A1 | * | 8/2007 | Hatanaka et al. | 324/207.25 |

FOREIGN PATENT DOCUMENTS

| | | |
|---|---|---|
| JP | 2004-069695 | 3/2004 |
| JP | 2005-069744 | 3/2005 |
| JP | 2005-331401 | 12/2005 |
| JP | 2006-276983 | 10/2006 |

* cited by examiner

*Primary Examiner* — Jay M Patidar
(74) *Attorney, Agent, or Firm* — Brinks Hofer Gilson & Lione

(57) ABSTRACT

Disclosed is a position detecting device provided with a magnetoresistive element that can accurately detect a position using a magnet and a detector that moves opposite to the magnet. A front surface of a magnet having a circular shape is magnetized to the N-pole, and a rear surface thereof is magnetized to the S-pole. A detector moves in the X-Y plane at a position that is spaced from the front surface of the magnet. The detector is provided with an X direction detecting element and a Y direction detecting element. The X direction detecting element and the Y direction detecting element are magnetoresistive elements. The front surface of the magnet is tapered such that the center thereof protrudes.

4 Claims, 10 Drawing Sheets

FIG. 11
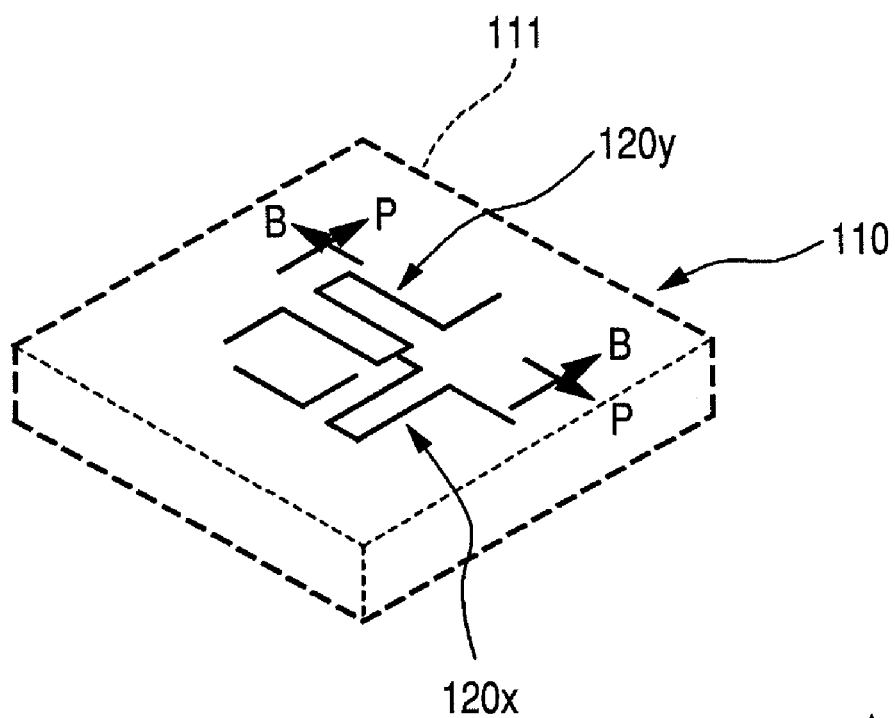
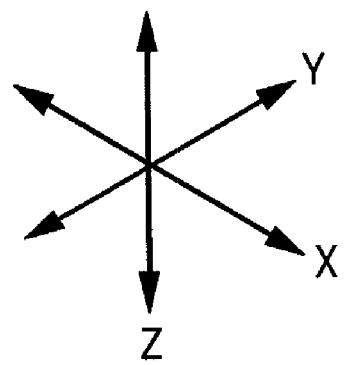

POSITION DETECTING DEVICE WITH A MAGNETORESISTIVE ELEMENT

CLAIM FOR PRIORITY

This application claims benefit of the Japanese Patent Application No. 2007-130462 filed on May 16, 2007, the entire content of which is hereby incorporated by reference.

BACKGROUND

1. Field of the Invention

The present invention relates to a position detecting device capable of detecting the position of a movable member in a plane using a magnetoresistive element and a magnet.

2. Description of the Related Art

JP-A-2005-331401, JP-A-2005-69744, and JP-A-2004-69695 disclose position detecting devices each having a magnet and a detector that detects a magnetic field generated from the magnet.

In the disclosed position detecting devices, the detector is provided with an element capable of detecting the intensity of a magnetic field, such as a Hall element, and detects the intensity of magnetic field components orthogonal to a front surface of the magnet, among the magnetic field generated from the front surface of the magnet, thereby detecting the position where the magnet and the detector face each other.

JP-A-2006-276983 discloses a magnetic sensor that detects a magnetic field generated from a circular magnet when the circular magnet moves. The magnetic sensor includes four giant magnetoresistive elements. Among the four giant magnetoresistive elements, two giant magnetoresistive elements detect an X-direction component of the magnetic flux from the magnet, and the other two giant magnetoresistive elements detect a Y-direction component of the magnetic flux from the magnet. Therefore, it is possible to detect the position of the magnet by calculating the difference between variations in the resistance values of the two giant magnetoresistive elements that detect the X-direction component of the magnetic flux, and the difference between variations in the resistance values of the two giant magnetoresistive elements that detect the Y-direction component of the magnetic flux.

In each of the disclosed position detecting devices, the front surface of the magnet is flat, and the detector provided with a detecting element, such as the Hall element or the giant magnetoresistive element, moves in a plane parallel to the front surface of the magnet while maintaining a constant distance from the front surface of the magnet. However, when the detector detects the intensity of the magnetic field generated from the front surface of the magnet, the detection output of the detector is not necessarily changed in proportion to a linear function of the distance from the center of the magnet to the edge thereof. Therefore, there is a limitation in accurately measuring the position where the detector faces the magnet on the basis of the detection output from the detector.

Further, when the detector facing the front surface of the magnet is moved in a narrow range including the center of the magnet, it is easy to obtain the detection output in proportion to the distance from the center of the magnet. However, a variation in the intensity of the magnetic field increases at a position that is distant from the center of the magnet. Therefore, there is a limitation in the detection accuracy of the magnet when the detector is moved in a wide distance range from the center of the magnet.

SUMMARY

According to an aspect of the invention, a position detecting device includes: a fixed member; and a movable member that moves relatively with respect to the fixed member. A magnet is provided in one of the fixed member and the movable member, and a detector that detects a magnetic field generated from the magnet is provided in the other member. The magnet has a front surface that faces the detector, and the front surface and a rear surface of the magnet are magnetized oppositely and have opposite magnetic poles with each other. The detector includes a detecting element that detects horizontal components of magnetic flux from the front surface to the edge of the magnet, and the distance between the front surface of the magnet and the detector gradually increases from the center of the magnet to the edge of the magnet.

In the position detecting device according to the above-mentioned aspect, the distance between the magnet and the detector gradually increases from the center of the magnet to the edge thereof. Therefore, when the detecting element of the detector detects the intensity of the horizontal component of the magnetic field, the intensity of the horizontal component is likely to be proportional to the distance from the center of the magnet. As a result, even when the position where the magnet faces the detector is distant from the center of the magnet, it is possible to accurately detect the position.

In the position detecting device according to the above-mentioned aspect, preferably, the detector includes an X direction detecting element that detects an X-direction component among the horizontal components of the magnetic flux and a Y direction detecting element that detects a Y-direction component orthogonal to the X-direction component.

According to the invention, when the position where the magnet faces the detector is distant from the center of the magnet, the output of the detector is likely to be approximate to a linear function of the distance from the center of the magnet. Therefore, it is possible to accurately detect the position where the magnet faces the detector on the basis of the detection output from the detector. In addition, even when a measurement range of the position where the magnet faces the detector magnet is set to be in a wide range including the center of the magnet as its center, it is possible to accurately determine the position where the magnet faces the detector on the basis of the detection output from the detector.

BRIEF DESCRIPTION OF THE DRAWINGS

FIG. 11 is a diagram illustrating a detector according to another embodiment.

DESCRIPTION OF THE EMBODIMENTS

Figure 1:
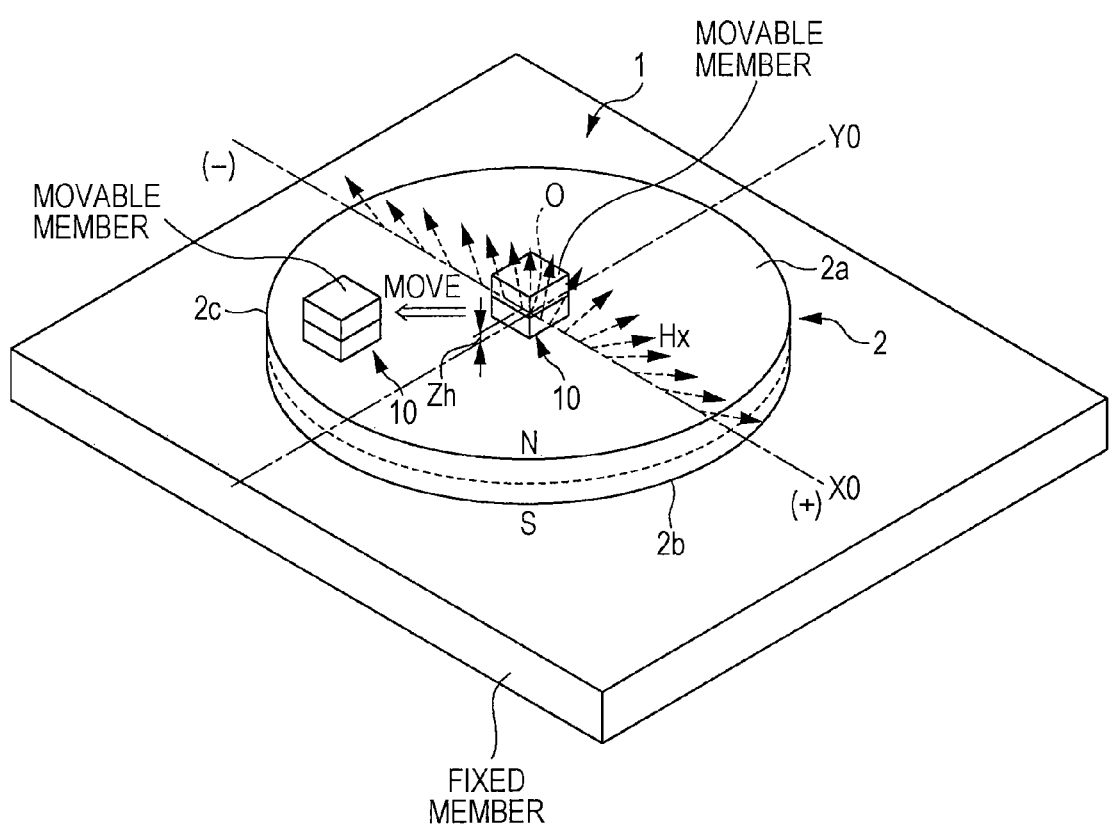
FIG. 1 is a perspective view illustrating the structure of a position detecting device.

FIG. 1 is a perspective view illustrating a position detecting device 1.

The position detecting device 1 includes a magnet 2 and a detector 10 that opposes to the magnet 2. The magnet 2 includes a front surface 2a and a rear surface 2b. An X0-axis and a Y0-axis shown in FIGS. 1 and 3 form an orthogonal coordinate system. A motion defining plane is set parallel to a plane including the X0-axis and the Y0-axis, and the magnet 2 moves to an arbitrary position in the X-Y coordinate system in the motion defining plane. Alternatively, the magnet 2 is fixed, and the detector 10 moves to an arbitrary position in the X-Y coordinate system in the motion defining plane.

In the following description, the thickness direction of the magnet is perpendicular to the front surface 2a of the magnet 2, and a plane orthogonal to the perpendicular line is a horizontal plane. The motion defining plane is parallel to the horizontal plane. When the magnet 2 has a circular shape, the gap between the surface of an edge 2c of the magnet 2 and the motion defining plane is uniform at any position of the edge (outer circumference) 2c of the magnet 2.

The position detecting device 1 is mounted in a small precision apparatus. The small precision apparatus is provided with a fixed member and a movable member. The movable member is set movable in the X-Y plane by a magnetic driving actuator that generates a driving force in an X direction and a magnetic driving actuator that generates a driving force in a Y direction. The magnet 2 is provided on one side of the fixed member and the movable member, and the detector 10 is provided on the other side. The position detecting device 1 detects the position of the movable member moved by the magnetic driving actuators. A control unit monitors a position detection output obtained from the position detecting device 1, which makes it possible to drive the movable member while accurately detecting the position of the movable member.

In this embodiment, it is assumed that the magnet 2 is provided in the fixed member and the detector 10 is provided in the movable member. However, as described above, the magnet 2 may be provided in the movable member, and the detector 10 may be provided in the fixed member.

The front surface 2a and the rear surface 2b of the magnet 2 have circular shapes, and the center of the circle, that is, the center of the magnet 2, is represented by 'O' in the drawings. An intersection point between the X0-axis and the Y0-axis in the rectangular coordinate system and the center O of the magnet 2 are disposed on the same perpendicular line extending from the front surface 2a of the magnet 2. As shown in FIG. 1, the front surface 2a of the magnet 2 is magnetized in the N-pole, and the rear surface 2b thereof is magnetized in the S-pole. Therefore, lines of magnetic flux run in the direction from the entire surface of the front surface 2a to the entire surface of the rear surface 2b. The detector 10 is disposed at a position that is spaced from the front surface 2a by a predetermined height Zh and moves in the motion defining plane that is parallel to the plane including the X0-axis and the Y0-axis. However, the detector 10 may face the rear surface 2b that is magnetized in the S-pole and move at a position that is spaced from the rear surface 2b at a predetermined distance.

Figure 2:
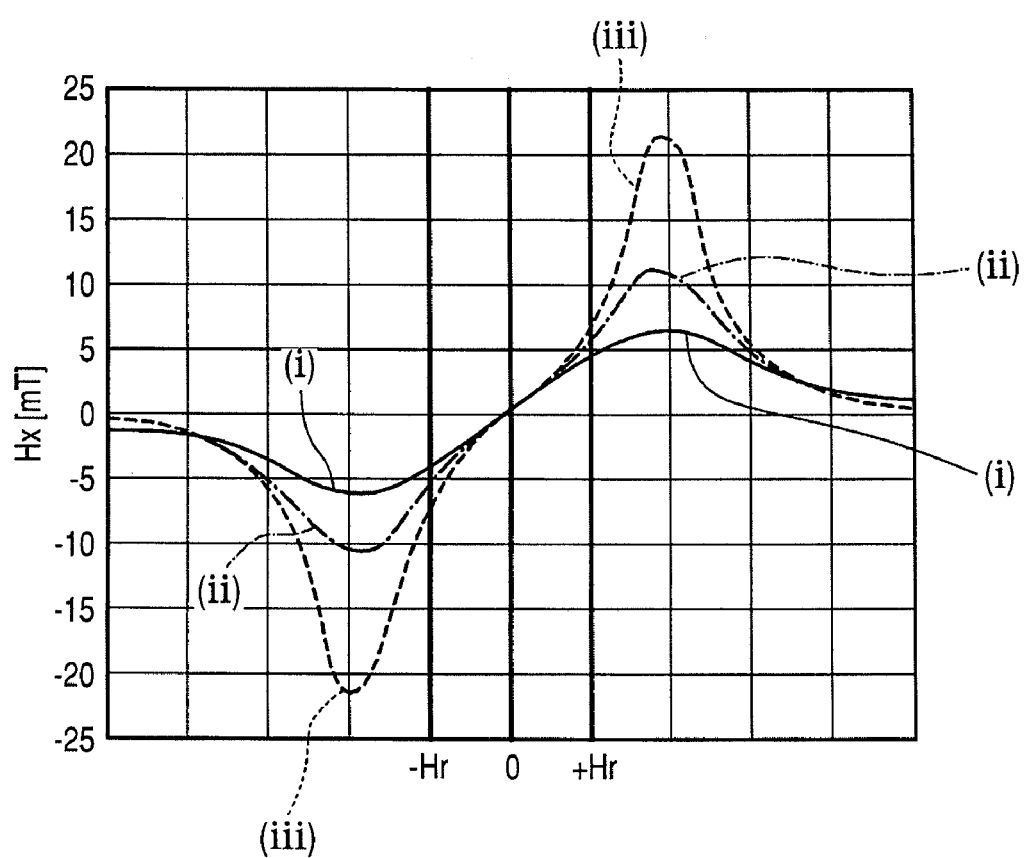
FIG. 2 is a graph illustrating a variation in the magnetic flux density Hx of a horizontal component on an X0-axis that extends in parallel direction with respect to a front surface of a magnet.

In FIG. 1, among the lines of magnetic flux that run in the direction from the N-pole front surface 2a of the magnet 2 to the S-pole rear surface 2b, only the lines of magnetic flux disposed on the X0-axis are shown with dotted lines. FIG. 2 is a graph illustrating a variation in the intensity of a horizontal direction component of a magnetic field at each position on the X0-axis when both the front surface 2a and the rear surface 2b of the magnet 2 are flat and the thickness of the magnet 2 is uniform at each of the positions. In FIG. 2, the horizontal axis indicates the distance from the center O of the magnet 2, and the vertical axis indicates the magnetic flux density Hx (mT) of X-direction components on the X0-axis at all the positions. The magnetic flux density Hx is a vector directed in the X-Y plane.

Theoretically, at the center O of the magnet 2, the direction of the line of magnetic flux is perpendicular to the X-Y plane, and the magnetic flux density of components of the magnetic field toward the X-Y plane is zero at the center O. On the front surface 2a of the magnet 2, as the distance from the center O in the radial direction increases, the inclination of the line of magnetic force with respect to the perpendicular line gradually increases. The magnetic flux density Hx of an X-direction component of the magnetic field generated from the front surface 2a of the magnet 2 becomes larger as the distance from the center O increases.

FIG. 2 shows the magnetic flux density Hx of the X-direction component of the magnetic field at the heights Zh of 1.5 mm, 1.0 mm, and 0.5 mm from the front surface 2a of the magnet 2 when the magnet 2 is formed in a circular shape with a diameter of 6 mm and a thickness of 1 mm and the front surface 2a of the magnet 2 is flat. A curved line (i) indicates a variation in the magnetic flux density Hx of the X-direction component at a height Zh of 1.5 mm, a curved line (ii) indicates a variation in the magnetic flux density Hx of the X-direction component at a height Zh of 1.0 mm, and a curved line (iii) indicates a variation in the magnetic flux density Hx of the X-direction component at a height Zh of 0.5 mm. In addition, in FIG. 2, the magnetic flux density Hx of a +X-direction component of the magnetic field is represented by a positive symbol, and the magnetic flux density Hx of a −X-direction component of the magnetic field is represented by a negative symbol.

On the front surface 2a of the magnet 2, a range of +Hr to −Hr with the center O interposed therebetween in the X direction is used as the detection range of the detector 10 that moves above the front surface 2a while facing it. The range of +Hr to −Hr depends on the diameter of the magnet or the intensity of the magnetic field. When the diameter of the magnet is equal to or larger than 5 mm or 6 mm, +Hr is +2 mm, and −Hr is −2 mm.

Figure 5A:
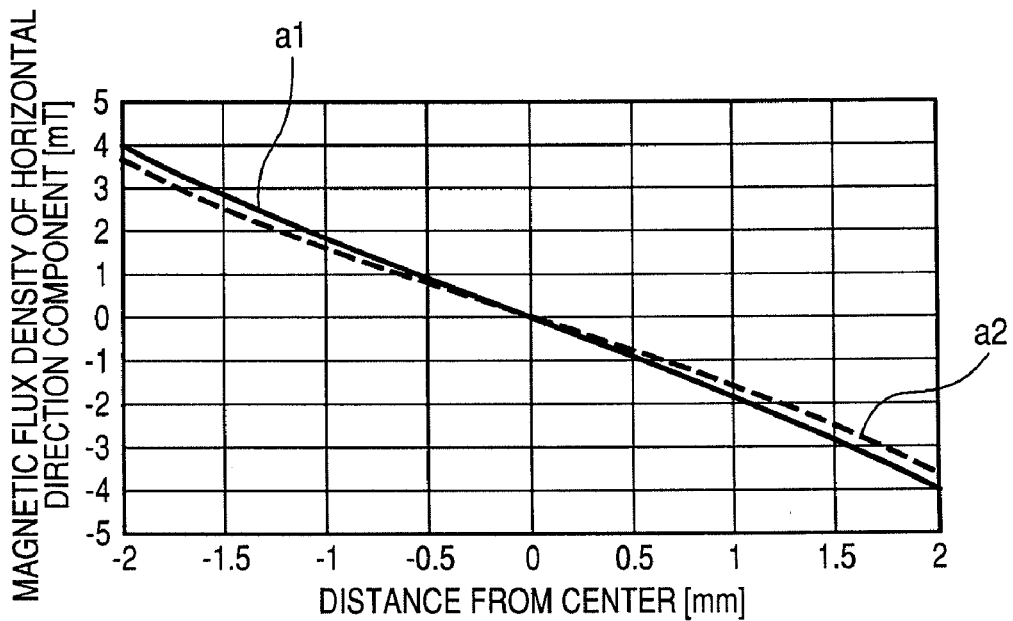
FIG. 5A is a graph illustrating a variation in the magnetic flux density of a horizontal component on a line that extends in parallel direction with respect to a flat front surface of a magnet.

FIG. 5A is a graph illustrating in detail the magnetic flux density of a horizontal direction component that is measured on a line, which touches the center O and is parallel to the front surface 2a at a height Zh of 1.5 mm from the front surface 2a, within the range of +2 mm (+Hr) to −2 mm (−Hr), when the magnet 2 has a circular shape and the front surface 2a of the magnet 2 is flat. In FIG. 5A, a variation in the magnetic flux density of the horizontal direction component on the line in a magnet having a diameter of 10 mm and a thickness of 1.5 mm is represented by 'a1', and a variation in the magnetic flux density of the horizontal direction component on the line in a magnet having a diameter of 10 mm and a thickness of 1.0 mm is represented by 'a2'.

Figure 4:
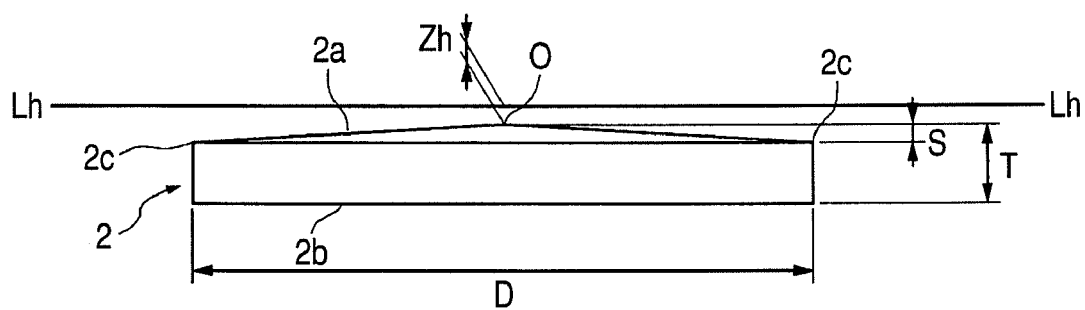
FIGS. 4A and 4B are side view illustrating a magnet used in a position detecting device according to an embodiment.
Figure 4A:
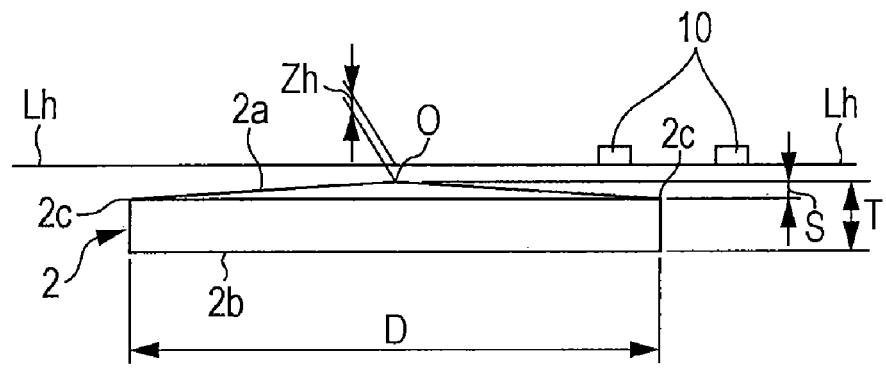
Figure 4B:
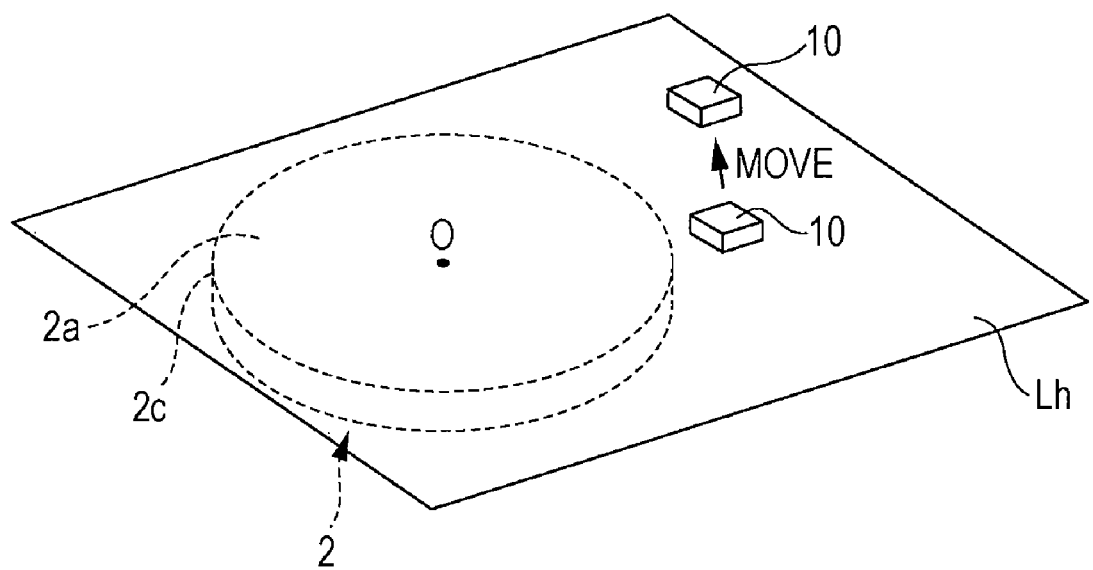
Figure 5B:
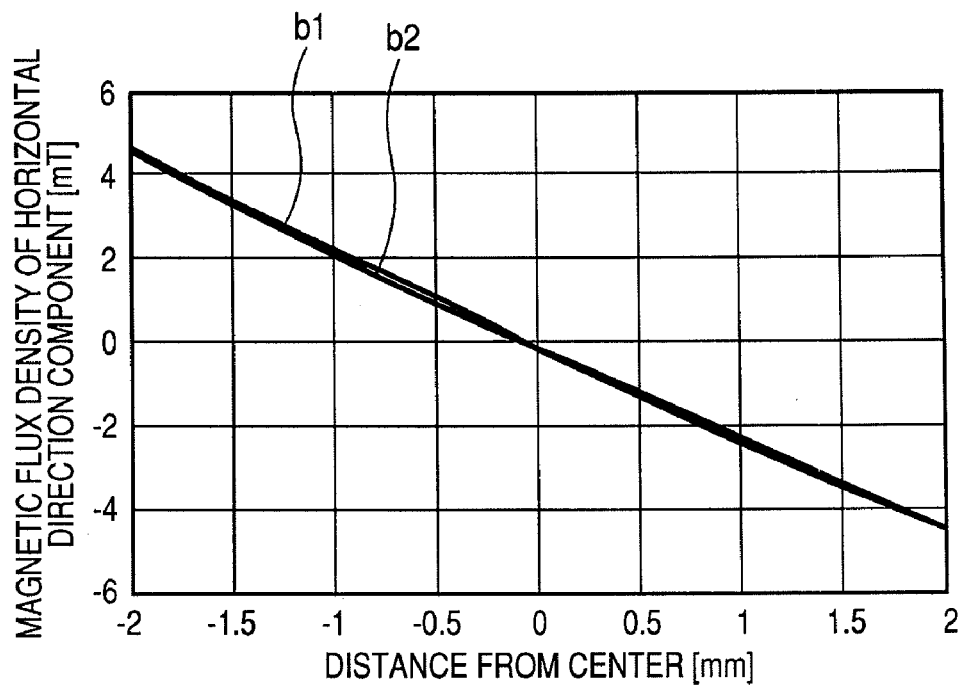
FIG. 5B is a graph illustrating a variation in the magnetic flux density of a horizontal component on a line that extends in parallel direction with respect to the front surface of the magnet shown in FIG. 4.

FIG. 5B shows a variation in the magnetic flux density of the horizontal direction component on the front surface 2a of the magnet 2 shown in FIG. 4. In the magnet 2 shown in FIG. 4, the front surface 2a is formed in a conical shape. That is, the front surface 2a is tapered such that its thickness is gradually decreased from the center O to the edge 2c. FIG. 5B is a graph illustrating a variation in the magnetic flux density of a horizontal direction component of the magnetic field that is measured on a line Lh touching the center O in parallel to the front surface 2a. The height Zh from the center of the magnet 2 to the line Lh is 1.5 mm. The variation in the magnetic flux density of the horizontal direction component is represented by 'b1' when the magnet has a diameter D of 10 mm and a thickness T of 1.5 mm and the inclined plane of the front surface 2a has a step difference S of 0.1 mm. The variation in the magnetic flux density of the horizontal direction component is represented by 'b2' when the magnet has a diameter D of 10 mm and a thickness T of 1.0 mm and the inclined plane of the front surface 2a has a step difference S of 0.1 mm.

The comparison between FIG. 5A and FIG. 5B proves that, when the front surface of the magnet 2 is tapered such that the center O thereof is the highest as shown in FIG. 4, the magnetic flux density of the horizontal component changes substantially in a linear function of the distance from the center O within the range of +Hr to −Hr (+2 mm to −2 mm).

Figure 6A:
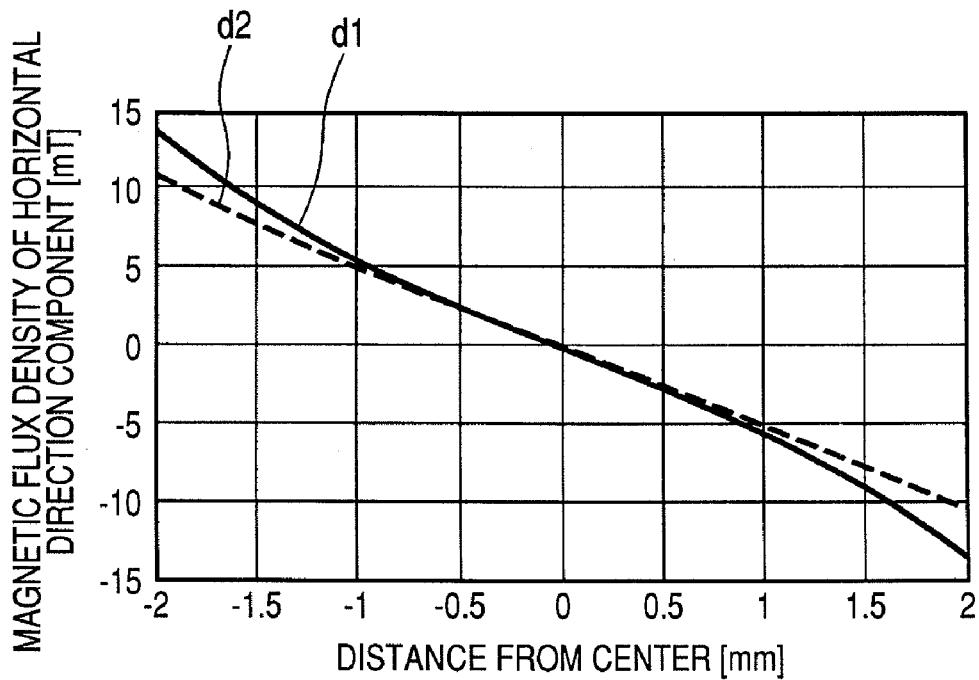
FIG. 6A is a graph illustrating a variation in the magnetic flux density of a horizontal component on a line that extends in parallel direction with respect to a flat front surface of a magnet.

FIG. 6A is a graph illustrating a variation in the magnetic flux density of the horizontal direction component of the magnetic field that is measured on a horizontal line, which touches the center O and is parallel to the front surface 2a at a height Zh of 1.5 mm from the front surface 2a, within a range of +2 mm (+Hr) to −2 mm (−Hr), when the magnet 2 has a circular shape and the front surface 2a is flat. In FIG. 6A, the variation in the magnetic flux density of the horizontal direction component in a magnet having a diameter of 6 mm and a thickness of 1.0 mm is represented by 'd1', and the variation in the magnetic flux density of the horizontal direction component in a magnet having a diameter of 6 mm and a thickness of 1.5 mm is represented by 'd2'.

Figure 6B:
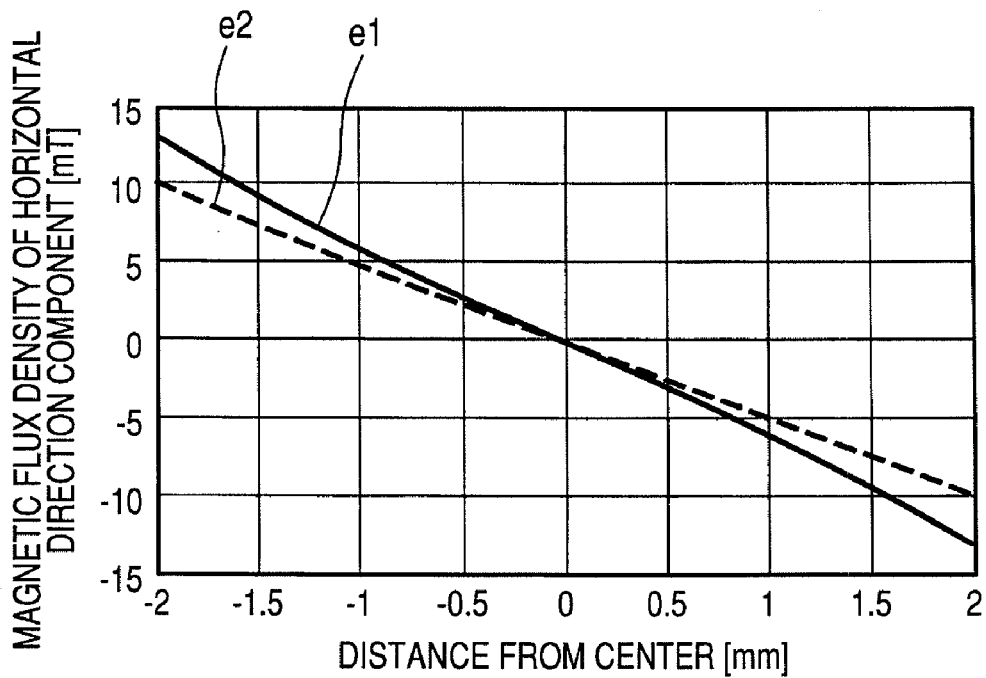
FIG. 6B is a graph illustrating a variation in the magnetic flux density of a horizontal component on a line that extends in parallel direction with respect to the front surface of the magnet shown in FIG. 4.

FIG. 6B is a graph illustrating a variation in the magnetic flux density of the horizontal direction component of the magnetic field that is measured on a horizontal line Lh touching the center O at a height Zh of 1.5 mm, in the magnet 2 shown in FIG. 4. The variation in the magnetic flux density of the horizontal direction component is represented by 'e1' when the magnet 2 has a diameter D of 6 mm, a thickness T of 1.0 mm, and a step difference S of 0.1 mm. The variation in the magnetic flux density of the horizontal direction component is represented by 'e2' when the magnet 2 has a diameter D of 6 mm, a thickness T of 1.5 mm, and a step difference S of 0.1 mm.

As can be seen from FIG. 6B, when the front surface 2a of the magnet 2 is tapered such that the center O thereof is the highest, as shown in FIG. 4, the magnetic flux density of the horizontal component changes substantially in proportion to the distance from the center O within the range of +Hr to −Hr (+2 mm to −2 mm).

As shown in FIG. 2, on a line that touches the center O at a position that is spaced from the front surface 2a of the magnet 2 by a constant distance Zh, within a range of about −1 mm to about +1 mm from the center O, the magnetic flux density of the horizontal component is substantially in proportion to the distance from the center O, that is, a radius. However, as closer to −Hr (−2 mm) from the center O and closer to +Hr (+2 mm) from the center O, the increase rate of the magnetic flux density of the horizontal direction component increases. Therefore, as closer to −Hr from the center O and closer to +Hr from the center O, the distance between the horizontal line Lh and the front surface 2a of the magnet 2 is gradually increased such that the increase rate of the magnetic flux density is cancelled. As a result, as shown in FIGS. 5B and 6B, the magnetic flux density of the horizontal direction component increases close to a linear function of the distance from the center O.

From the results of FIGS. 5B and 6B, the diameter of the magnet 2 is 5 mm or more, preferably, 6 mm or more. The thickness of the magnet is 0.8 mm or more, preferably, in a range of about 1.0 mm to about 1.5 mm. The ratio of the step difference S of the tapered plane to the radius of the magnet 2 (2S/D) is preferably in a range of about 0.1/5 to about 0.1/3.

When the ratio of the step difference S of the tapered plane to the radius of the magnet 2 (2S/D) is within the above-mentioned range, an intersection line between a vertical cross-section touching the center O and the tapered plane of the front surface 2a is not necessarily a straight line as shown in FIG. 4, but it may be a curved line.

As shown in FIGS. 5B and 6B, in the range of +Hr to −Hr, when the magnetic flux density along the motion defining plane that is parallel to the front surface of the magnet 2 changes in a linear function in proportion to the radius of the magnet from the center thereof, it is possible to detect the position where the detector 10 and the magnet 2 are opposite to each other on the X and Y coordinates by measuring the magnetic flux density of the X-direction component and the magnetic flux density of the Y-direction component in the front surface 2a of the magnet 2.

Figure 3:
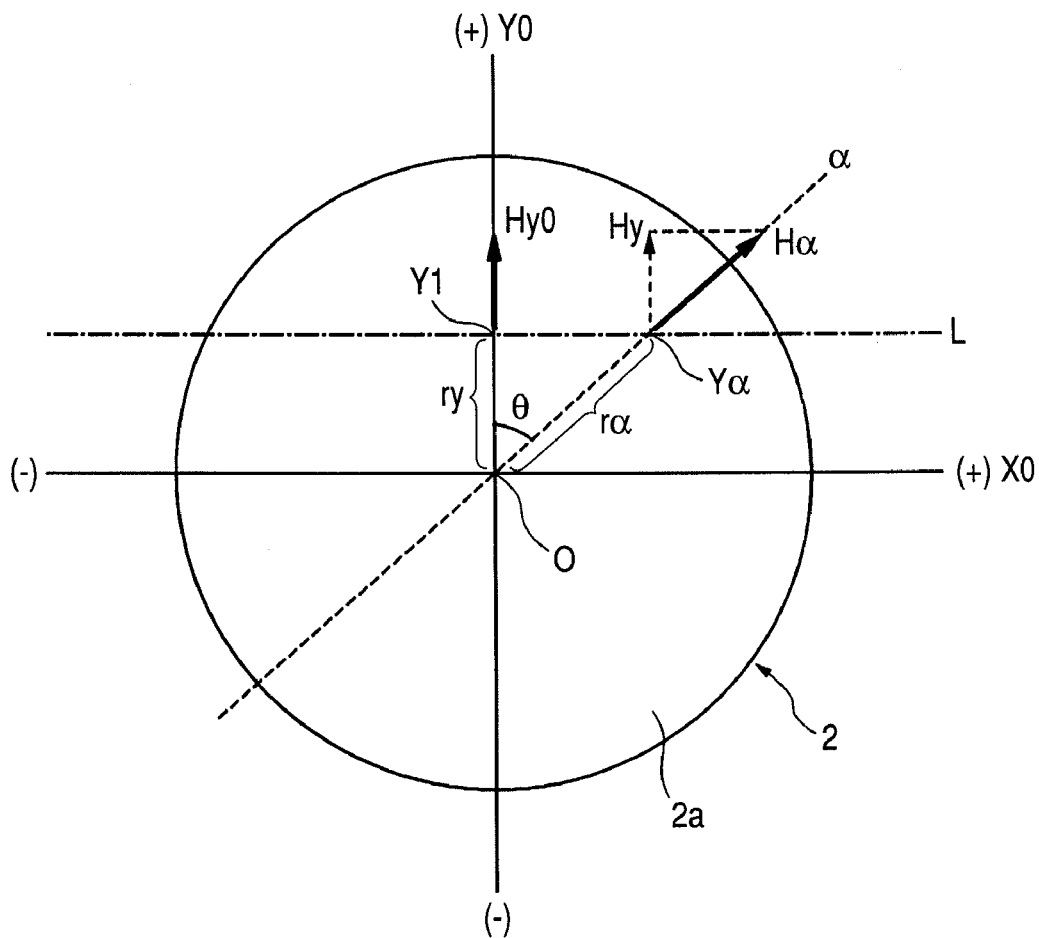
FIG. 3 is a plan view illustrating the magnet.

In FIG. 3, the X0-axis and the Y0-axis intersect each other at the center O of the magnet 2. In addition, a radial axis that is other than the X0-axis and the Y0-axis and is a line touching the center O is represented by 'α'. The front surface 2a of the magnet 2 has a circular shape. In the magnetic field that is generated from the front surface 2a of the magnet 2, the magnetic flux density Hα of an α-direction component on the radial axis α is changed substantially in a linear function at the same rate as that at which the magnetic flux density Hx of the X-direction component of the magnetic field on the X0-axis and the magnetic flux density Hy of the Y-direction component of the magnetic field on the Y0-axis are changed.

In FIG. 3, in the front surface 2a of the magnet 2, a line that is parallel to the X0-axis and touches a point Y1 on the Y0-axis is represented by 'L'. The distance from the center O to the point Y1 on the Y0-axis is a radius 'ry'. When an intersection point between the radial axis α and the line L is referred to as Yα, the distance from the center O to the intersection point Yα is a radius 'rα'.

The intensity of the Y-direction component of the magnetic field at the point Y1 is referred to as Hy0, and the intensity of the α-direction component of the magnetic field at the intersection point Yα is referred to as Hα. When the radius from the center O is within the range of −Hr to +Hr, the magnetic flux density Hy0 of the horizontal direction component is substantially proportional to the radius ry, and the magnetic flux density Hα is also substantially proportional to the radius rα. The proportional constant of the magnetic flux density Hy0 when the position on the Y0-axis changes is equal to that of the magnetic flux density Hα when the position on the radial axis α is changed, and the proportional constant is a linear function. When the proportional constant of the linear function is 'a', the magnetic flux density Hy0 is a·ry, and the magnetic flux density Hα is a·rα.

When an angle formed between the Y0-axis and the radial axis α is θ, the magnetic flux density Hy of the Y-direction component of the magnetic field at the intersection point Yα is Hy=Hα·cos θ=a·rα·cos θ. Since rα·cos θ=ry, Hy is a·ry=Hy0.

That is, if the radius from the center O is in the range of −Hr to +Hr, the magnetic flux density Hy of the Y-direction component of the magnetic field is constant at any position on the line that is parallel to the X0-axis, and the magnetic flux density Hx of the X-direction component of the magnetic field is constant at any position on the line that is parallel to the Y0-axis.

Figure 7:
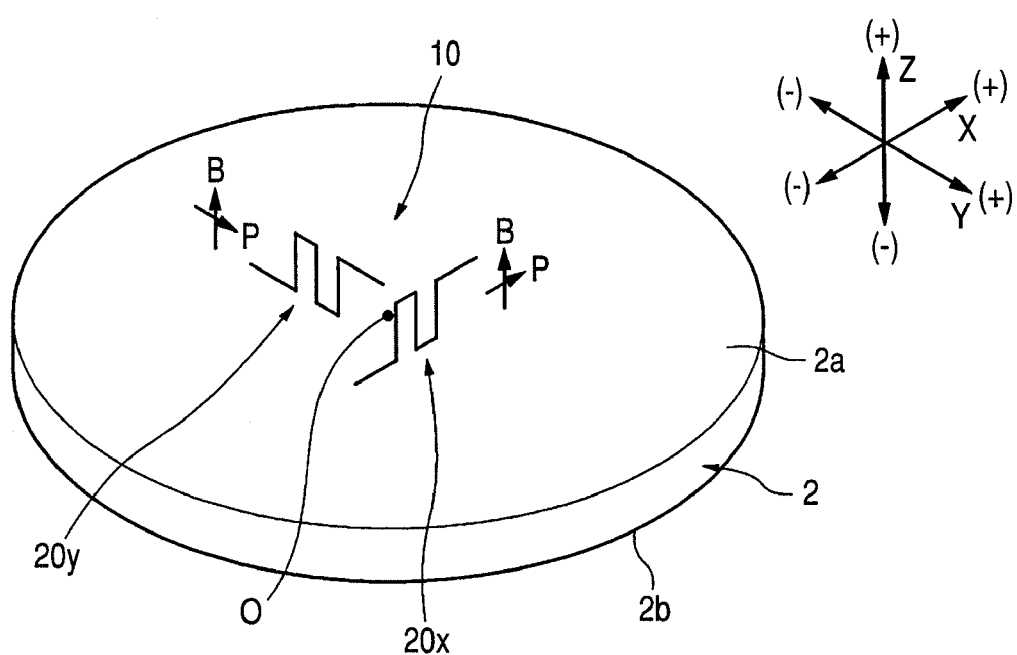
FIG. 7 is a perspective view illustrating the positional relationship between the magnet, and an X direction detecting element and a Y direction detecting element provided in the detector according to the embodiment.

As shown in FIG. 7, the detector 10 is provided with an X direction detecting element 20x and a Y direction detecting element 20y. The X direction detecting element 20x and the Y direction detecting element 20y are magnetoresistive elements, and have sizes that are sufficiently smaller than those shown in FIG. 7. The distance between the X direction detecting element 20x and the Y direction detecting element 20y is very small. Therefore, when the detector 10 provided with the X direction detecting element 20x and the Y direction detecting element 20y is moved in the X-Y plane that is parallel with respect to the front surface 2a of the magnet 2, it can be considered that the X direction detecting element 20x and the Y direction detecting element 20y are disposed substantially at the same coordinates in the X-Y plane.

Therefore, it is possible to detect a position where the detector 10 faces the magnet 2 on the X and Y coordinates by moving the detector 10 in the horizontal plane to detect the magnetic flux density Hdx of the X-direction component of the magnetic field using the X-direction detecting element 20x and the magnetic flux density Hdy of the Y-direction component of the magnetic field using the Y direction detecting element 20y.

Figure 8A:
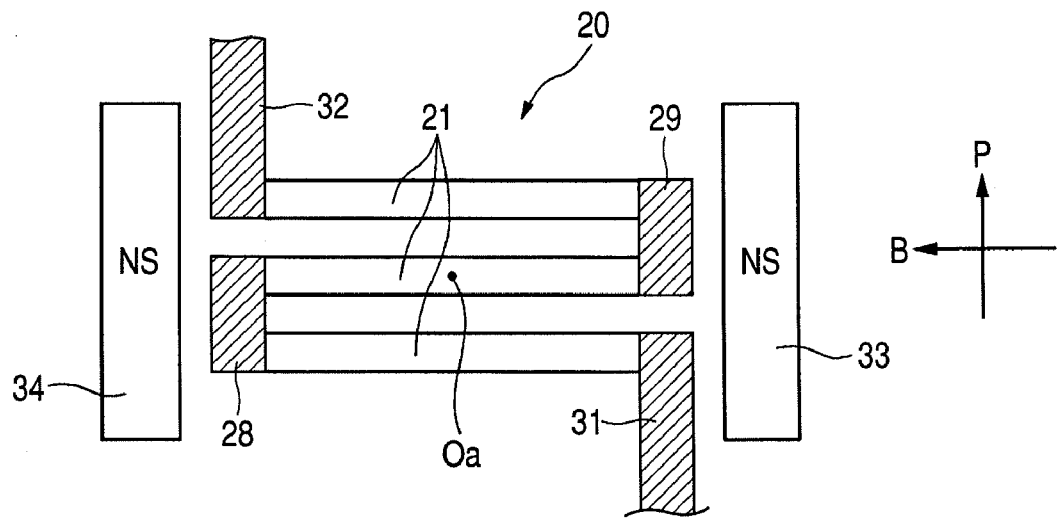
FIG. 8A is a plan view illustrating the structure of a magnetoresistive element.

The magnetoresistive element 20 includes a plurality of element portions 21 that are arranged parallel to each other, connection electrodes 28 and 29 which connect two leading ends and two rear ends of the element portions 21, respectively, and lead electrodes 31 and 32 that are connected to the lowermost and uppermost element portions 21, respectively. In this way, the element portions 21 are connected in series to each other to form a meander pattern. In FIG. 8A, the geometric center of the element portion 21 is represented by 'Oa'.

Figure 9:
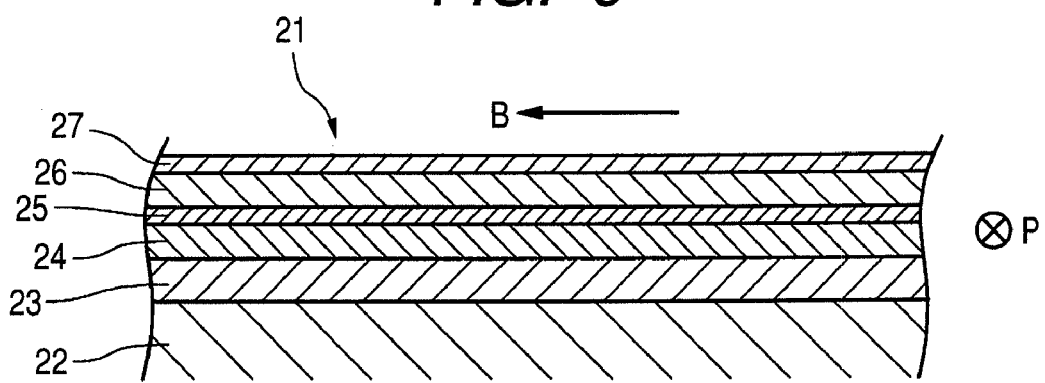
FIG. 9 is a cross-sectional view illustrating element portions of the magnetoresistive element.

As shown in a cross-sectional view of FIG. 9, each of the element portions 21 is formed of a laminate of a substrate 22, an anti-ferromagnetic layer 23, a pinned magnetic layer 24, a non-magnetic conductive layer 25, and a free magnetic layer 26 that are formed in this order, and the surface of the free magnetic layer 26 is covered with a protective layer 27.

The anti-ferromagnetic layer 23 is formed of an anti-ferromagnetic material, such as an Ir—Mn alloy (iridium-manganese alloy). The pinned magnetic layer 24 is formed of a soft magnetic material, such as a Co—Fe alloy (cobalt-iron alloy). The non-magnetic conductive layer 25 is formed of, for example, Cu (copper). The free magnetic layer 26 is formed of a soft magnetic material, such as a Ni—Fe alloy (nickel-iron alloy). The protective layer 27 is formed of Ta (tantalum).

Figure 8B:
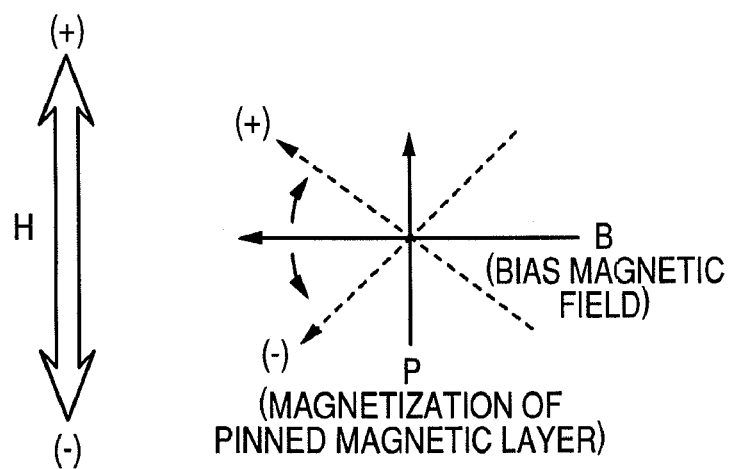
FIG. 8B is a diagram illustrating the magnetization direction of a pinned magnetic layer of the magnetoresistive element and the direction of a bias magnetic field.

In the element portion 21, the magnetization direction of the pinned magnetic layer 24 is fixed by anti-ferromagnetic coupling between the anti-ferromagnetic layer 23 and the pinned magnetic layer 24. As shown in FIG. 8B, in each of the element portions 21, the fixed magnetization direction (direction P) of the pinned magnetic layer 24 is orthogonal to the longitudinal direction of the element portion 21.

As shown in FIG. 8A, the magnetoresistive element 20 has a magnet 33 provided at its right side and a magnet 34 provided at its left side, and a bias magnetic field is applied to each of the element portions 21 in a direction that is parallel to the longitudinal direction of the element portion 21. The bias magnetic field puts the magnetization of the free magnetic layer 26 into a single magnetic domain state in a direction B. As represented by a solid line in FIG. 8B, when the intensity H of an external magnetic field acting in a direction parallel to the direction (direction P) in which the magnetization of the pinned magnetic layer 24 is fixed is zero, the free magnetic layer 26 is magnetized in the direction B in which the bias magnetic field acts. That is, the magnetization direction of the free magnetic layer 26 is orthogonal to the fixed magnetization direction (direction P) of the pinned magnetic layer 24.

The electric resistance of the magnetoresistive element 20 varies from the relationship between the fixed magnetization direction (direction P) of the pinned magnetic layer 24 and the magnetization direction of the free magnetic layer 26. When an external magnetic field (+)H is applied to the element portions 21 of the magnetoresistive element 20 in the upward direction of FIG. 8B (a positive (+) direction parallel to the fixed direction P), the magnetization direction of the free magnetic layer 26 on which the bias magnetic field is acting is inclined to the positive (+) direction. In this case, a relative angle between the magnetization direction of the free magnetic layer 26 and the fixed magnetization direction (direction P) of the pinned magnetic layer 24 becomes small, which results in a decrease in the electric resistance. In contrast, when an external magnetic field (−)H is applied to the element portions 21 of the magnetoresistive element 20 in the downward direction of FIG. 8B (a negative (+) direction parallel to the fixed direction P), the magnetization direction of the free magnetic layer 26 on which the bias magnetic field is acting is inclined to the negative (−) direction. As the slope of the inclination increases, a relative angle between the magnetization direction of the free magnetic layer 26 and the fixed magnetization direction (direction P) of the pinned magnetic layer 24 increases, which results in an increase in the electric resistance.

As shown in FIG. 7, the X direction detecting element 20x provided in the detector 10 has the same structure as the magnetoresistive element 20, and faces the front surface 2a of the magnet 2 such that its geometric center Oa shown in FIG. 8A is spaced from the front surface 2a in a height (Zh) range of 0.5 mm to 1.5 mm. Similarly, the Y direction detecting element 20y has the same structure as the magnetoresistive element 20, and faces the front surface 2a of the magnet 2 such that its geometric center Oa is spaced from the front surface 2a in a height (Zh) range of 0.5 mm to 1.5 mm.

As shown in FIG. 7, in the X direction detecting element 20x, the fixed magnetization direction (direction P) of the pinned magnetic layer 24 of the element portion 21 is aligned with the (+)X direction, and the bias direction (direction B) is aligned with the (+)Z direction, that is, an upward direction perpendicular to the X-Y plane. In addition, in the Y direction detecting element 20y, the fixed magnetization direction (direction P) of the pinned magnetic layer 24 of the element portion 21 is aligned with the (+)Y direction, and the bias direction (direction B) is aligned with the (+)Z direction, that is, an upward direction perpendicular to the X-Y plane. Therefore, in the X direction detecting element 20x and the Y direction detecting element 20y, the fixed magnetization directions (directions P) of the pinned magnetic layers 24 are orthogonal to each other in the X-Y plane.

Figure 10:
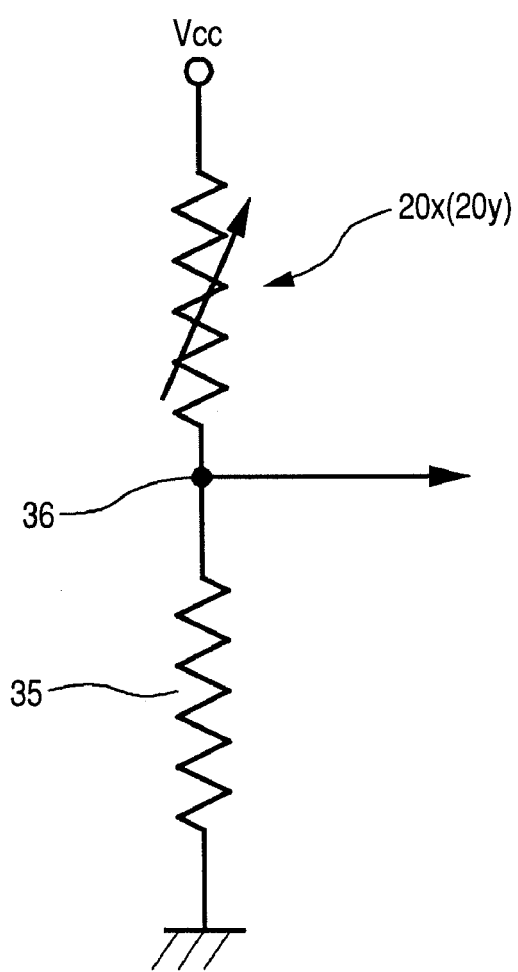
FIG. 10 is a circuit diagram illustrating an example of the circuit structure of the detector.

FIG. 10 is a diagram illustrating an example of a detecting circuit that detects a variation in the resistance of the X direction detecting element 20x in the detector 10. In the detecting circuit, the X direction detecting element 20x and a fixed resistive element 35 are connected in series to each other, and a power supply voltage Vcc, which is a constant voltage, is applied to the X direction detecting element 20x and the fixed resistive element 35 connected in series to each other. In addition, a node 36 between the X direction detecting element 20x and the fixed resistive element 35 serves as an output unit that outputs a detection signal on the basis of a variation in the resistance of the X direction detecting element 20x. When no external magnetic field is applied, the resistance value of the X direction detecting element 20x is equal to that of the fixed resistive element 35.

When the detector 10 moves to the (+)X side of the center O of the magnet 2, the magnetization direction of the free magnetic layer 26 in the X direction detecting element 20x is inclined to the (+)X direction, and the electric resistance of the X direction detecting element 20x decreases gradually. Therefore, the potential of the node 36 shown in FIG. 10 is higher than Vcc/2. In contrast, when the detector 10 moves to the (−)X side of the center O of the magnet 2, the magnetization direction of the free magnetic layer 26 in the X direction detecting element 20x is inclined to the (−)X direction, and the electric resistance of the X direction detecting element 20x increases. Therefore, the potential of the node 36 shown in FIG. 10 is lower than Vcc/2. In this way, it is possible to detect the distance of the detector 10 moved from the center O of the magnet 2 to the (+)X side or the (−)X side by detecting the potential of the node 36.

In the detector 10, similar to the circuit structure shown in FIG. 10, the Y direction detecting element 20y and a fixed resistive element 35 are connected in series to each other, and when no external magnetic field is applied, the position of a node 36 is set to Vcc/2. Further, when the detector 10 moves to the (+)Y side through the center O of the magnet 2, the potential of the node 36 is higher than Vcc/2. When the detector 10 moves to the (−)Y side through the center O of the magnet 2, the potential of the node 36 is lower than Vcc/2. In this way, it is possible to detect the distance of the detector 10 moved from the center O of the magnet 2 to the (+)Y side or the (−)Y side by detecting the potential of the node 36 between the Y direction detecting element 20y and the fixed resistive element 35.

FIG. 11 is a diagram illustrating a detector 110 according to a second embodiment.

The detector 110 includes an X direction detecting element 120x and a Y direction detecting element 120y as the magnetoresistive elements 20 having the same structure as that shown in FIG. 8. In the X direction detecting element 120x, the fixed magnetization direction (direction P) of a pinned magnetic layer 24 is aligned with the X direction, and the direction (direction B) of a bias magnetic field applied to a free magnetic layer 26 is aligned with the Y direction. In the Y direction detecting element 120y, the fixed magnetization direction (direction P) of a pinned magnetic layer 24 is aligned with the Y direction, and the direction (direction B) of a bias magnetic field applied to a free magnetic layer 26 is aligned with the X direction.

When the detector 110 shown in FIG. 11 moves to the (+)X side through the center O of the magnet 2, the magnetization direction of the free magnetic layer 26 in the X direction detecting element 120x is inclined to the (+)X direction, and the electric resistance of the X direction detecting element 120x decreases. When the detector 110 moves to the (−)X side through the center O of the magnet 2, the electric resistance of the X direction detecting element 120x increases. Therefore, it is possible to detect the position between the detector 110 faces the magnet 2 on the X coordinate by configuring a series circuit of the X direction detecting element 120x and the fixed resistive element 35, applying a power supply voltage Vcc to the series circuit, and detecting the potential of the node 36, as shown in FIG. 10. This is similarly applied to the Y direction detecting element 120y.

Further, in the invention, the detector may be provided with only the X direction detecting element 20x to detect only the position moved in the X direction, or only the position moved in the Y direction. In this case, the magnet may have a rectangular shape that is elongated in the X direction or the Y direction. This structure can function as a rear sensor that detects the position moved in the X direction or the Y direction.

Further, the front surface of the magnet 2 may be flat, and a guide mechanism may be provided which guides the movement of the detector 10 such that the distance between the detector 10 and the front surface 2a of the magnet 2 increases gradually as the detector 10 moves from the center O of the magnet 2 in the radius direction

The invention claimed is:

1. A position detecting device comprising:
    a fixed member; and
    a movable member being movable relatively to the fixed member,
    a magnet provided in one of the fixed member and the movable member,
    a detector that detects a magnetic field generated from the magnet being provided in the other member,
    wherein the magnet has a front surface that faces the detector,
    wherein the front surface and a rear surface of the magnet are magnetized to different magnetic poles,
    wherein the detector includes a detecting element that detects horizontal components of magnetic flux running from the front surface to the edge of the magnet,
    wherein the distance between the front surface of the magnet and the detector gradually increases from the center of the magnet to the edge of the magnet,
    wherein the detector includes an X direction detecting element that detects an X-direction component among the horizontal components of the magnetic flux and a Y direction detecting element that detects a Y-direction component orthogonal to the X-direction component,
    wherein the front surface of the magnet has a circular shape, and
    wherein the distance between the detector and the front surface of the magnet gradually increases from the center to the edge of the magnet in all directions from the center to the edge of the magnet.

2. The position detecting device according to claim 1, wherein the center of the front surface of the magnet protrudes from the edge of the magnet toward the detector.

3. The position detecting device according to claim 2, wherein the movable member is movable in a plane.

4. The position detecting device according to claim 2, wherein, in a cross-sectional view taken along a cross-section passing through the center of the magnet, an intersection line disposed between the front surface and the cross-section inclines to the plane.

* * * * *